(12) United States Patent
Choi

(10) Patent No.: US 12,347,380 B2
(45) Date of Patent: Jul. 1, 2025

(54) DISPLAY APPARATUS

(71) Applicant: Samsung Display Co., Ltd., Yongin-si (KR)

(72) Inventor: Jonghyun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/600,515

(22) Filed: Mar. 8, 2024

(65) Prior Publication Data

US 2024/0321207 A1    Sep. 26, 2024

(30) Foreign Application Priority Data

Mar. 24, 2023 (KR) .................. 10-2023-0039063
Jun. 15, 2023 (KR) .................. 10-2023-0077062

(51) Int. Cl.
*G09G 3/3233* (2016.01)
*H10K 59/124* (2023.01)

(52) U.S. Cl.
CPC ......... *G09G 3/3233* (2013.01); *H10K 59/124* (2023.02); *G09G 2300/0408* (2013.01); *G09G 2300/0426* (2013.01); *G09G 2300/0819* (2013.01); *G09G 2300/0842* (2013.01); *G09G 2300/0861* (2013.01)

(58) Field of Classification Search
CPC .. H10K 59/131; H10K 59/124; G09G 3/3233; G09G 2300/0426; G09G 2300/0819; G09G 2300/0842; G09G 2300/0408; G09G 2300/0861
See application file for complete search history.

(56) References Cited

U.S. PATENT DOCUMENTS

| | | | |
|---|---|---|---|
| 10,868,096 B2 | 12/2020 | Park et al. | |
| 11,177,335 B2 | 11/2021 | Park et al. | |
| 11,435,792 B2 | 9/2022 | Hu et al. | |
| 11,609,463 B2 | 3/2023 | Hanada | |
| 2016/0118451 A1* | 4/2016 | Youn ............... | H10K 59/124 257/66 |
| 2017/0288168 A1* | 10/2017 | Kim ................. | H10K 59/12 |
| 2022/0005918 A1 | 1/2022 | Murai et al. | |
| 2022/0246086 A1 | 8/2022 | Son et al. | |
| 2022/0309974 A1 | 9/2022 | Park et al. | |

FOREIGN PATENT DOCUMENTS

| | | |
|---|---|---|
| JP | 2017-168308 A | 9/2017 |
| JP | 2022-166675 A | 11/2022 |
| KR | 10-2022-0111779 A | 8/2022 |

* cited by examiner

*Primary Examiner* — Doon Y Chow
(74) *Attorney, Agent, or Firm* — Womble Bond Dickinson (US) LLP

(57) ABSTRACT

A display apparatus includes: a substrate having a first display area, a second display area, a third display area between the first display area and the second display area, and a non-display area; a first connection pixel circuit in the first display area; a second connection pixel circuit in the second display area; a driver circuit in the third display area; a signal connection line connected to a first contact portion of the first connection pixel circuit and a second contact portion of the second connection pixel circuit and extending in a first direction to pass the third display area; and an inorganic insulating layer comprising a first groove between the driver circuit and at least any one of the first contact portion and the second contact portion, the first groove extending in a second direction and crossing the signal connection line in a plan view.

20 Claims, 8 Drawing Sheets

DISPLAY APPARATUS

CROSS-REFERENCE TO RELATED APPLICATION

The present application claims priority to and the benefit of Korean Patent Application No. 10-2023-0039063, filed on Mar. 24, 2023, and Korean Patent Application No. 10-2023-0077062, filed on Jun. 15, 2023, in the Korean Intellectual Property Office, the entire disclosures of each of which are incorporated herein by reference.

BACKGROUND

1. Field

Aspects of one or more embodiments relate to a display apparatus.

2. Description of the Related Art

Recently, display apparatuses have been widely used. Also, because the thickness and weight of the display apparatuses has decreased, the use thereof has widened.

As display apparatuses have been utilized in various ways and for various applications, diverse methods for designing the shapes of the display apparatuses have been employed. An increase in the occupied areas of display areas in display apparatuses results in the addition of functions embedded onto or linked with the display apparatuses.

The above information disclosed in this Background section is only for enhancement of understanding of the background and therefore the information discussed in this Background section does not necessarily constitute prior art.

SUMMARY

Aspects of one or more embodiments include a high-resolution display apparatus that may be relatively robust, resistant, and flexible to external impact.

The characteristics of embodiments according to the present disclosure are not limited to the characteristics described herein, and other characteristics that are not specifically mentioned may be clearly understood by one of ordinary skill in the art from the description of embodiments according to the present disclosure.

Additional aspects will be set forth in part in the description which follows and, in part, will be apparent from the description, or may be learned by practice of the presented embodiments of the disclosure.

According to one or more embodiments, a display apparatus includes a substrate in which a first display area, a second display area, a third display area between the first display area and the second display area, and a non-display area are defined, a first connection pixel circuit arranged in the first display area, a second connection pixel circuit arranged in the second display area, a driver circuit arranged in the third display area, a signal connection line connected to a first contact portion of the first connection pixel circuit and a second contact portion of the second connection pixel circuit and extending in a first direction to pass the third display area, and an inorganic insulating layer including a first groove between the driver circuit and at least any one of the first contact portion and the second contact portion, the first groove extending in a second direction and crossing the signal connection line in a plane.

According to some embodiments, the display apparatus may further include an organic insulating layer, at least a portion of which is buried in the first groove.

According to some embodiments, a dielectric constant of the organic insulating layer may be less than or equal to about 3.5.

According to some embodiments, the display apparatus may further include a connection electrode arranged above the organic insulating layer, and a display element arranged above the connection electrode and including a pixel electrode, an emission layer, and an opposite electrode, wherein at least a portion of the emission layer may overlap the driver circuit.

According to some embodiments, the inorganic insulating layer may further include a second groove extending in the second direction and in parallel with the first groove with the first contact portion or the second contact portion therebetween.

According to some embodiments, the first contact portion may be arranged on an edge portion of the first connection pixel circuit that is adjacent to the driver circuit, and the second contact portion may be arranged on an edge portion of the second connection pixel circuit that is adjacent to the driver circuit.

According to some embodiments, the signal connection line may bypass the driver circuit.

According to some embodiments, the signal connection line may be provided in plural, and the inorganic insulating layer may further include a third groove between two adjacent signal connection lines among the plurality of signal connection lines.

According to some embodiments, the inorganic insulating layer may further include a fourth groove between the signal connection line and the driver circuit, the fourth groove extending in the first direction.

According to some embodiments, the first display area, the third display area, and the second display area may be arranged in the first direction.

According to one or more embodiments, a display apparatus includes a substrate in which a first display area, a second display area, a third display area between the first display area and the second display area, and a non-display area are defined, a first connection pixel circuit arranged in the first display area and including a first contact portion adjacent to the third display area, a second connection pixel circuit arranged in the second display area and including a second contact portion adjacent to the third display area, a driver circuit arranged in the third display area, a signal connection line extending in the first direction and having an end connected to the first contact portion and another end connected to the second contact portion, an inorganic insulating layer including a plurality of grooves, and an organic insulating layer filling the plurality of grooves, wherein a first groove among the plurality of grooves extends in a second direction crossing the first direction and is between the driver circuit and the first contact portion and between the driver circuit and the second contact portion.

According to some embodiments, the signal connection line may cross the third display area and bypass the driver circuit.

According to some embodiments, the signal connection line may cross the first groove in a plan view.

According to some embodiments, a dielectric constant of the organic insulating layer may be less than or equal to about 3.5.

According to some embodiments, the display apparatus may further include a connection electrode arranged above the organic insulating layer, and a display element arranged above the connection electrode and including a pixel electrode, an emission layer, and an opposite electrode, wherein at least a portion of the emission layer may overlap the driver circuit in the plane.

According to some embodiments, the plurality of grooves may further include a second groove extending in the second direction and in parallel with the first groove with the first contact portion or the second contact portion therebetween.

According to some embodiments, the signal connection line may be provided in plural, and the plurality of grooves may further include a third groove between two adjacent signal connection lines among the plurality of signal connection lines.

According to some embodiments, the plurality of grooves may further include a fourth groove between the signal connection line and the driver circuit, the fourth groove extending in the first direction.

According to some embodiments, a distance from an upper surface of the substrate to a lower surface of each of the third groove and the fourth groove may be less than or equal to a distance from the upper surface of the substrate to a lower surface of the signal connection line.

According to some embodiments, the first display area, the third display area, and the second display area may be arranged in the first direction.

Other aspects, features, and characteristics other than those described above herein become apparent from the following detailed description, claims (and their equivalents, and drawings for carrying out the disclosure.

The general and specific aspects may be implemented by using a system, a method, a computer program, or any combination thereof.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
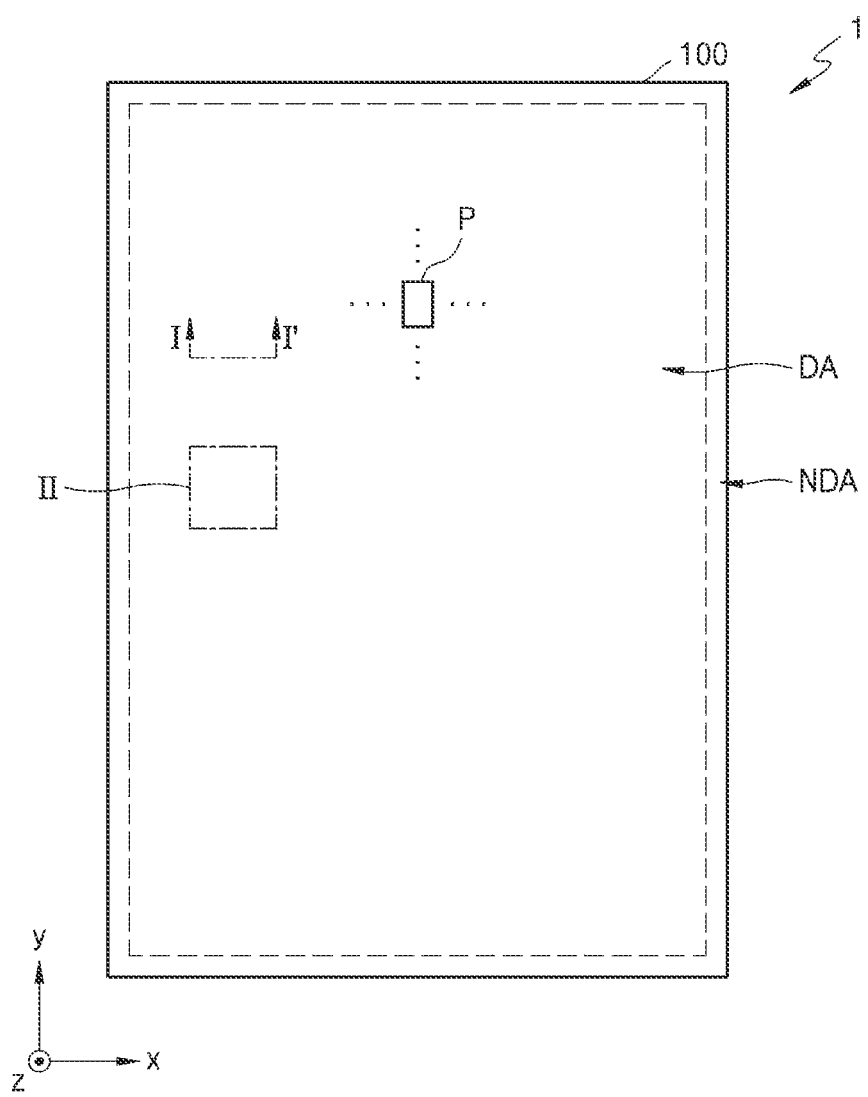
FIG. 1 is a schematic plan view of a display apparatus according to some embodiments.

Reference will now be made in more detail to aspects of some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or any combination of a, b, and/or c.

As the disclosure allows for various changes and numerous embodiments, particular embodiments will be shown in the drawings and described in detail in the written description. The attached drawings for illustrating embodiments of the present disclosure are referred to in order to gain a sufficient understanding of the present disclosure, the merits thereof, and the objectives accomplished by the implementation of the present disclosure. The disclosure may, however, be embodied in many different forms and should not be construed as being limited to the embodiments set forth herein.

Hereinafter, aspects of some embodiments of the disclosure will be described in detail with reference to the accompanying drawings. Like elements in the drawings denote like elements, and repeated descriptions thereof are omitted.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation. In other words, because sizes and thicknesses of elements in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the present disclosure, an expression such as "A and/or B" indicates A, B, or A and B. Also, an expression such as "at least one of A and B" indicates A, B, or A and/or B.

It will be understood that when a layer, region, or component is referred to as being connected to another layer, region, or component, it can be directly and/or indirectly connected to the other layer, region, or component. That is, for example, intervening layers, regions, or components may be present. For example, when a layer, region, or component is referred to as being electrically connected to another layer, region, or component, it can be directly or indirectly electrically connected to the other layer, region, or component.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a schematic plan view of a display apparatus according to some embodiments.

A display apparatus 1 may display a moving image (e.g., video images) or a still image (e.g., static images) and may be used as a display screen for various products, for example, a portable electronic apparatus, such as a mobile phone, a smartphone, a tablet Personal Computer (PC), a mobile communication terminal, a personal digital assistant, an e-book terminal, a Portable Multimedia Player (PMP), a navigation device, or an Ultra Mobile PC (UMPC), a television (TV), a laptop, a monitor, a billboard, an Internet of Things (IoT) device, and the like. Also, the display apparatus 1 may be used in a wearable device, such as a smartwatch, a watch phone, an eyewear display, or a head-mounted display (HMD). Also, the display apparatus 1 may be used as a display screen in an instrument cluster of a vehicle, a Center Information Display (CID) mounted on a center fascia or a dashboard of a vehicle, a room mirror display replacing a side-view mirror of a vehicle, or a car headrest monitor provided for rear-seat entertainment.

According to some embodiments, the display apparatus 1 may be overall planar, bent, or curved. According to some embodiments, the display apparatus 1 may be bent so that display surfaces may face each other. According to some embodiments, the display apparatus 1 may be bent to make the display surface face outwards. The term "display surface" may indicate a surface on which images are displayed, the display surface may include a display area DA and a non-display area NDA, and images may be provided to a user through the display area DA. The term "bent" may indicate that a shape is not constant and may be changed from an original shape to another one, and may indicate that a display surface is folded along one or more lines, that is, a folding axis, curved, or rolled like a scroll.

The display apparatus 1 may externally provide or display images by using light emitted from the display area DA. Because the display apparatus 1 includes a substrate 100, the substrate 100 may include the display area DA and the non-display area NDA. In other words, the display area DA and the non-display area NDA may be defined on the substrate 100. The non-display area NDA may surround at least a portion of the display area DA. According to some embodiments, the non-display area NDA may surround (e.g., in a periphery or outside a footprint of) the display area DA.

The substrate 100 may include various materials, such as glass, metals, and plastic. According to some embodiments, the substrate 100 may include a flexible material. The flexible material may be a material that is relatively easily curved, bent, folded, or rolled. The substrate 100 including the flexible material may include ultra-thin glass, metal, or plastic.

As shown in FIG. 1, the display area DA may have a rectangular shape. In another example, the display area DA may have a polygonal shape, such as a triangle, a pentagon, or a hexagon, a circular shape, an oval shape, or an atypical shape. According to some embodiments, the display area DA may have rounded corners, rounded edges, a general circular shape, and/or a general elliptical shape.

In the display area DA of the substrate 100, pixels P including various display elements, such as organic light-emitting diodes OLED, may be arranged. The pixel P may be provided in the plural, and the pixels P may be arranged in various forms, such as a stripe form, a Pentile form, and a mosaic form, to realize images. In the present specification, each pixel P indicates a sub-pixel emitting light of a different color and may be, for example, one of a red sub-pixel, a green sub-pixel, and a blue sub-pixel. Although FIG. 1 illustrates a single pixel P, as a person having ordinary skill in the art would appreciate, the display area DA may include any suitable number of pixels P (e.g., arranged in a matrix configuration of rows and columns) according to the design and size of the display apparatus 1.

As a display apparatus according to some embodiments, an organic light-emitting display apparatus is described, but the display apparatus is not limited thereto. As another example, the display apparatus may be, for example, an inorganic light-emitting display apparatus (or an inorganic EL display apparatus) or a quantum dot light-emitting display apparatus. For example, an emission layer of a display element included in a display apparatus may include an organic material, an inorganic material, quantum dots, both an organic material and quantum dots, both an inorganic material and quantum dots, or an organic material, an inorganic material, and quantum dots.

Figure 2:
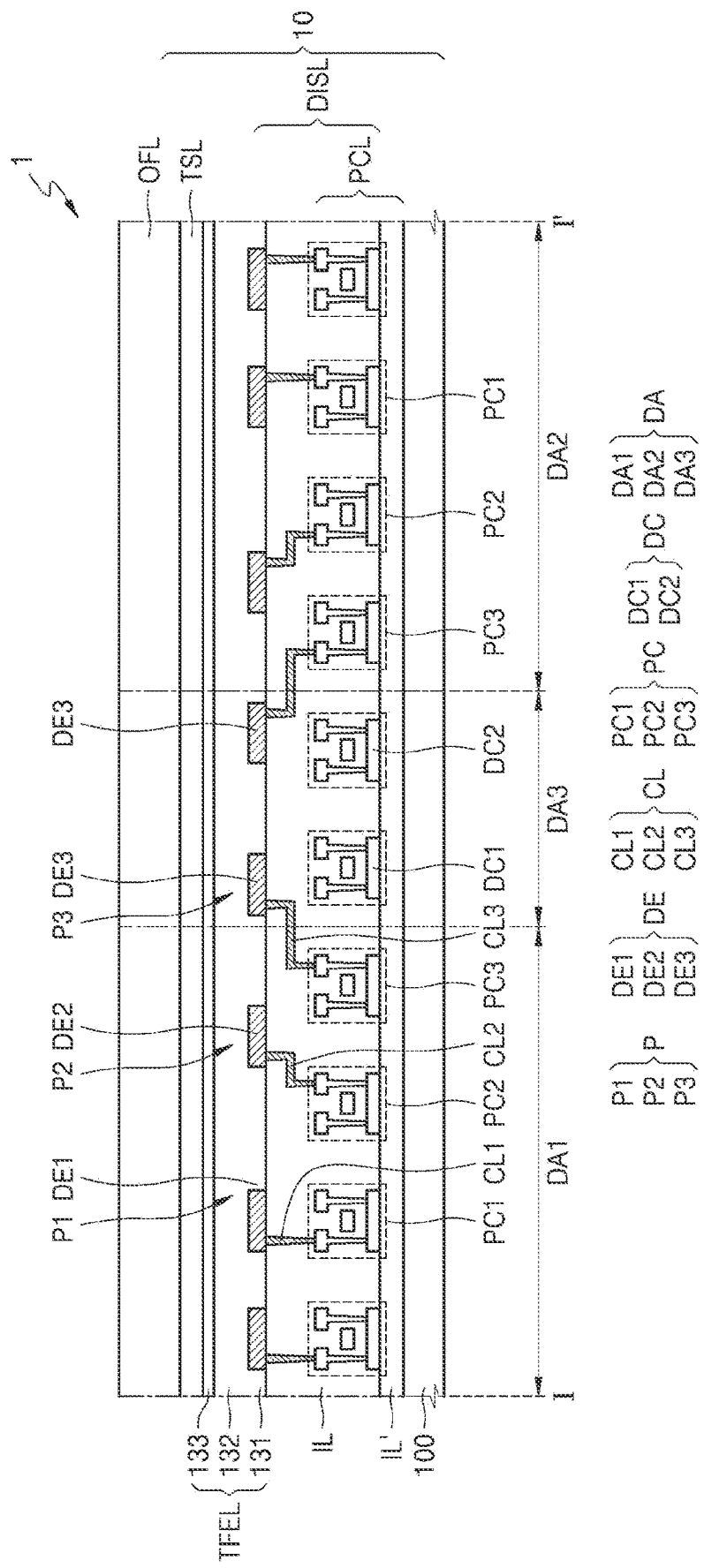
FIG. 2 is an example cross-sectional view of a portion of the display apparatus of FIG. 1, taken along a line I-I' according to some embodiments.

FIG. 2 is an example cross-sectional view of a portion of the display apparatus of FIG. 1, taken along a line I-I'.

Referring to FIG. 2, the display apparatus 1 may include a display panel 10. The display apparatus 1 may further include a support layer that may overlap the display panel 10, and a cover window for protecting the display panel 10 may be further located above the display panel 10.

The display panel 10 may include the substrate 100, a display layer DISL located on the substrate 100, a touch sensor layer TSL, and an optical functional layer OFL. The display panel 10 may include the display area DA. The display area DA may include a first display area DA1, a second display area DA2, and a third display area DA3. The third display area DA3 may be located between the first display area DA1 and the second display area DA2. The first display area DA1, the third display area DA3, and the second display area DA2 may be arranged in a first direction (e.g., an x direction).

The substrate 100 may include an insulating material, such as glass, quartz, or polymer resin. The substrate 100 may be a flexible substrate that is bendable, foldable, or rollable.

The display layer DISL may include a circuit layer PCL, display elements DE located above the circuit layer PCL, and an encapsulation layer, such as a thin-film encapsulation layer TFEL or a sealing substrate. Insulating layers IL and IL' may be arranged between the substrate 100 and the display layer DISL and in the display layer DISL. According to some embodiments, the display element DE may be an organic light-emitting diode including an organic emission layer. Alternatively, the display element DE may be a light-emitting diode LED. The size of the light-emitting diode LED may be on a micro-scale or a nanoscale. For example, the light-emitting diode LED may be a micro-light-emitting diode. Alternatively, the light-emitting diode LED may be a nanorod light-emitting diode. The nanorod light-emitting diode may include gallium nitride (GaN). According to some embodiments, a color conversion layer may be located above the nanorod light-emitting diode. The color conversion layer may include quantum dots. Alternatively, the display element DE may be a quantum dot light-emitting diode including a quantum dot emission layer.

Alternatively, the display element DE may be an inorganic light-emitting diode including an inorganic semiconductor.

The display area DA may include a first pixel P1, a second pixel P2, and a third pixel P3. The first pixel P1 may include a first pixel circuit PC1 and a first display element DE1 connected thereto. The first pixel circuit PC1 may include at least one thin-film transistor and control the emission of the first display element DE1. The second pixel P2 may include a second pixel circuit PC2 and a second display element DE2 connected thereto. The second pixel circuit PC2 may include at least one thin-film transistor and control the emission of the second display element DE2. The third pixel P3 may include a third pixel circuit PC3 and a third display element DE3 connected thereto. The third pixel circuit PC3 may include at least one thin-film transistor and control the emission of the third display element DE3.

The first pixel P1 may be arranged in the first display area DA1. That is, the first pixel circuit PC1, the first display element DE1, and a first connection line CL1 connecting the first pixel circuit PC1 to the first display element DE1 may be arranged in the first display area DA1.

The second pixel P2 may be arranged in the first display area DA1. That is, the second pixel circuit PC2, the second display element DE2, and a second connection line CL2 connecting the second pixel circuit PC2 to the second display element DE2 may be arranged in the first display area DA1.

The third pixels P3 may be distributed and arranged in the first display area DA1 and the third display area DA3. Referring to FIG. 2, the third pixel circuit PC3 may be located in the first display area DA1, and the third display element DE3 may be located in the third display area DA3. Thus, a third connection line CL3 connecting the third pixel circuit PC3 to the third display element DE3 may extend from the first display area DA1 to the third display area DA3 and may be arranged.

Referring to FIG. 2, the first pixel P1 and the second pixel P2 may be arranged in not only the first display area DA1 but in the second display area DA2. The third pixels P3 may be distributed and arranged in the second display area DA2 and the third display area DA3.

The display area DA may further include driver circuits DC. The driver circuits DC may be configured to generate, for example, scan signals applied to a gate electrode of a switching thin-film transistor electrically connected to pixel electrodes in the display area DA. The driver circuits DC may include a first driver circuit DC1 and a second driver circuit DC2. In this case, a type of the first driver circuit DC1 may be a scan driver circuit, and a type of the second driver circuit DC2 may be an emission driver circuit.

The driver circuits DC may be arranged in the third display area DA3. That is, the third display elements DE3 arranged in the third display area DA3 may overlap at least any one of the driver circuits DC.

In the display apparatus 1 according to some embodiments, an area of the non-display area NDA where no pixels are arranged, that is, a dead space, may be relatively reduced. A driver circuit portion, a power supply line, etc. may be arranged near edges of the substrate 100. In an existing display apparatus, display elements DE are not arranged in regions where a driver circuit portion, a power supply line, etc. are arranged, and thus, an area of a dead space is great.

However, referring to FIG. 2, in the display apparatus 1, the driver circuits DC such as the first driver circuit DC1 and the second driver circuit DC2 may be arranged in the display area DA, and some of the display elements DE are located above the driver circuits DC. That is, the third display area DA3 may include the driver circuits DC and the third display element DE3 overlapping the same. The third pixel circuit PC3 controlling the emission of the third display element DE3 may be located in the first display area DA1 as the third connection line CL3 extends. Accordingly, as the driver circuitry, the power supply line, or the like may be located under the display elements DE, a dead space that may be generated because of the driver circuitry or the power supply line may be effectively relatively reduced.

Figure 3:
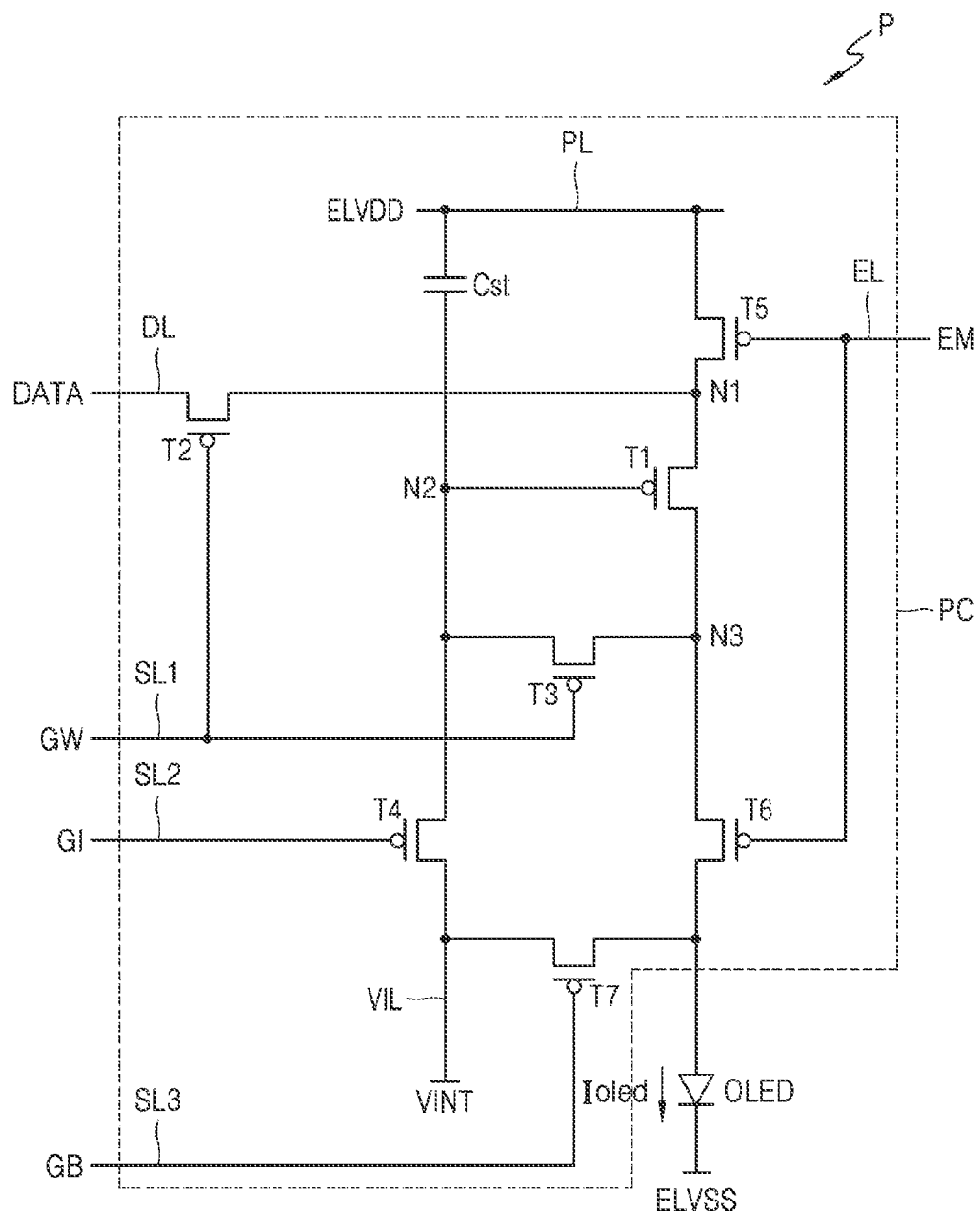
FIGS. 3 and 4 each are a schematic equivalent circuit diagram of any one of pixel circuits arranged in a display panel according to some embodiments.
Figure 4:
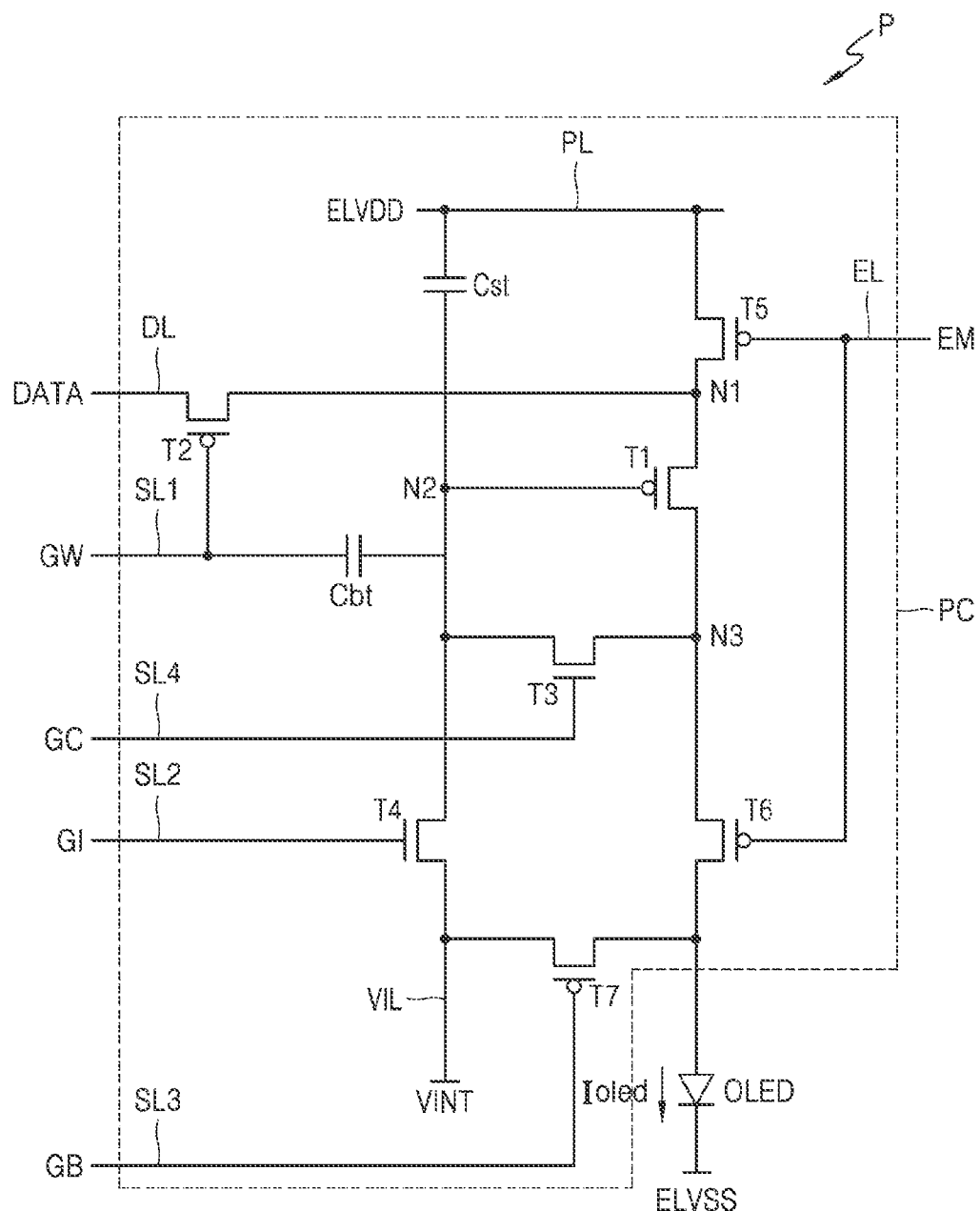

FIGS. 3 and 4 each are a schematic equivalent circuit diagram of any one of pixel circuits arranged in a display panel.

The pixel circuits PC of pixels P shown in FIGS. 3 and 4 may be the first pixel circuit PC1 of the first pixel P1, the second pixel circuit PC2 of the second pixel P2, and the third pixel circuit PC3 of the third pixel P3. Hereinafter, the pixel circuit PC of the pixel P is referred to as a pixel circuit PC for convenience.

Referring to FIG. 3, the pixel circuit PC may include a first transistor T1 to a seventh transistor T7. Depending on types (an N type or a P type) and/or operation conditions of transistors, a first terminal of a transistor may be a source electrode or a drain electrode, and a second terminal may be different from the first terminal. For example, when the first terminal is a source electrode, the second terminal may be a drain electrode.

The pixel circuit PC may be connected to a first scan line SL1 configured to transmit a first scan signal GW, a second scan line SL2 configured to transmit a second scan signal GI, a third scan line SL3 configured to transmit a third scan signal GB, an emission control line EL configured to transmit an emission control signal EM, a data line DL configured to transmit a data signal DATA, a driving power line PL configured to transmit a driving voltage ELVDD, and an initialization voltage line VIL configured to transmit an initialization voltage VINT. The pixel circuit PC may be connected to the organic light-emitting diode OLED as a display element.

The first transistor T1 may be connected between the driving power line PL and the organic light-emitting diode OLED. The first transistor T1 may be connected between a first node N1 and a third node N3. The first transistor T1 may be connected to the driving power line PL via (or through) the fifth transistor T5 and electrically connected to the organic light-emitting diode OLED via (or through) the sixth transistor T6. The first transistor T1 may include a gate electrode connected to a second node N2, a first terminal connected to the first node N1, and a second terminal connected to the third node N3. The driving power line PL may be configured to transmit the driving voltage ELVDD to the first transistor T1. The first transistor T1 may function as a driving transistor and receive a data signal DATA according to a switching operation of the second transistor T2, thereby providing a driving current Ioled to the organic light-emitting diode OLED.

The second transistor T2 (a data write transistor) may be connected between the data line DL and the first node N1. The second transistor T2 may be connected to the driving power line PL via the fifth transistor T5. The second transistor T2 may include a gate electrode connected to the first scan line SL1, a first terminal connected to the data line DL, and a second terminal connected to the first node N1. The second transistor T2 may be turned on in response to the first scan signal GW transmitted through the first scan line SL1 and perform a switching operation whereby a data signal DATA transmitted through the data line DL is transmitted to the first node N1.

The third transistor T3 (a compensation transistor) may be connected between the second node N2 and the third node N3. The third transistor T3 may be connected to the organic light-emitting diode OLED via the sixth transistor T6. The third transistor T3 may include a gate electrode connected to the first scan line SL1, a first terminal connected to the second node N2, and a second terminal connected to the third node N3. The third transistor T3 may be turned on in response to the first scan signal GW transmitted through the first scan line SL1 and diode-connect the first transistor T1, thus compensating for a threshold voltage of the first transistor T1.

The fourth transistor T4 (a first initialization transistor) may be connected between the second node N2 and the initialization voltage line VIL. The fourth transistor T4 may include a gate electrode connected to the second scan line SL2, a first terminal connected to the second node N2, and a second terminal connected to the initialization voltage line VIL. The fourth transistor T4 may be turned on in response to the second scan signal GI transmitted through the second scan line SL2 and configured to transmit the initialization voltage VINT to the gate electrode of the first transistor T1, thereby initializing the gate electrode of the first transistor T1.

The fifth transistor T5 (a first emission control transistor) may be connected between the driving power line PL and the first node N1. The sixth transistor T6 (a second emission control transistor) may be connected between the third node N3 and the organic light-emitting diode OLED. The fifth transistor T5 may include a gate electrode connected to the emission control line EL, a first terminal connected to the driving power line PL, and a second terminal connected to the first node N1. The sixth transistor T6 may include a gate electrode connected to the emission control line EL, a first terminal connected to the third node N3, and a second terminal connected to the pixel electrode of the organic light-emitting diode OLED. The fifth transistor T5 and the sixth transistor T6 may be simultaneously (or concurrently) turned on in response to the emission control signal EM transmitted through the emission control line EL, and thus, a driving current may flow in the organic light-emitting diode OLED.

The seventh transistor T7 (a second initialization transistor) may be connected between the organic light-emitting diode OLED and the initialization voltage line VIL. The seventh transistor T7 may include a gate electrode connected to the third scan line SL3, a first terminal connected to the second terminal of the sixth transistor T6 and the pixel electrode of the organic light-emitting diode OLED, and a second terminal connected to the initialization voltage line VIL. The seventh transistor T7 may be turned on in response to the third scan signal GB transmitted through the third scan line SL3 and configured to transmit the initialization voltage VINT to the pixel electrode of the organic light-emitting diode OLED, thereby initializing the pixel electrode of the organic light-emitting diode OLED.

A capacitor Cst may include a first electrode connected to the gate electrode of the first transistor T1 and a second electrode connected to the driving power line PL. The capacitor Cst may store and maintain a voltage corresponding to a difference in voltages of the driving power line PL and both ends of the gate electrode of the first transistor T1 so that a voltage applied to the gate electrode of the first transistor T1 may be maintained.

The organic light-emitting diode OLED may include the pixel electrode (a first electrode or anode) and an opposite electrode (a second electrode or a cathode), and the opposite electrode may receive the common voltage ELVSS. The organic light-emitting diode OLED may receive the driving current from the first transistor T1 and emit light, and thus, images are displayed.

FIG. 3 shows that the first transistor T1 to the seventh transistor T7 each are a P-type transistor. One or more embodiments are not limited thereto. For example, the first transistor T1 to the seventh transistor T7 may each be an N-type transistor, or some of the first transistor T1 to the seventh transistor T7 may each be an N-type transistor, and the others thereof may each be a P-type transistor. FIG. 4 shows that the third transistor T3 and the fourth transistor T4 among the first transistor T1 to the seventh transistor T7 each are an N-type transistor, and the others thereof each are a P-type transistor. The third transistor T3 and the fourth transistor T4 may respectively include semiconductor layers including oxide, and the other transistors may respectively include semiconductor layers including silicon.

Additionally, according to some embodiments, the pixel P may include additional components or fewer components than what is illustrated in FIGS. 3 and 4 without departing from the spirit and scope of embodiments according to the present disclosure.

According to some embodiments, an organic light-emitting diode is employed as a display element, but according to some embodiments, an inorganic light-emitting diode or a quantum dot light-emitting diode may be employed as a display element.

Figure 5:
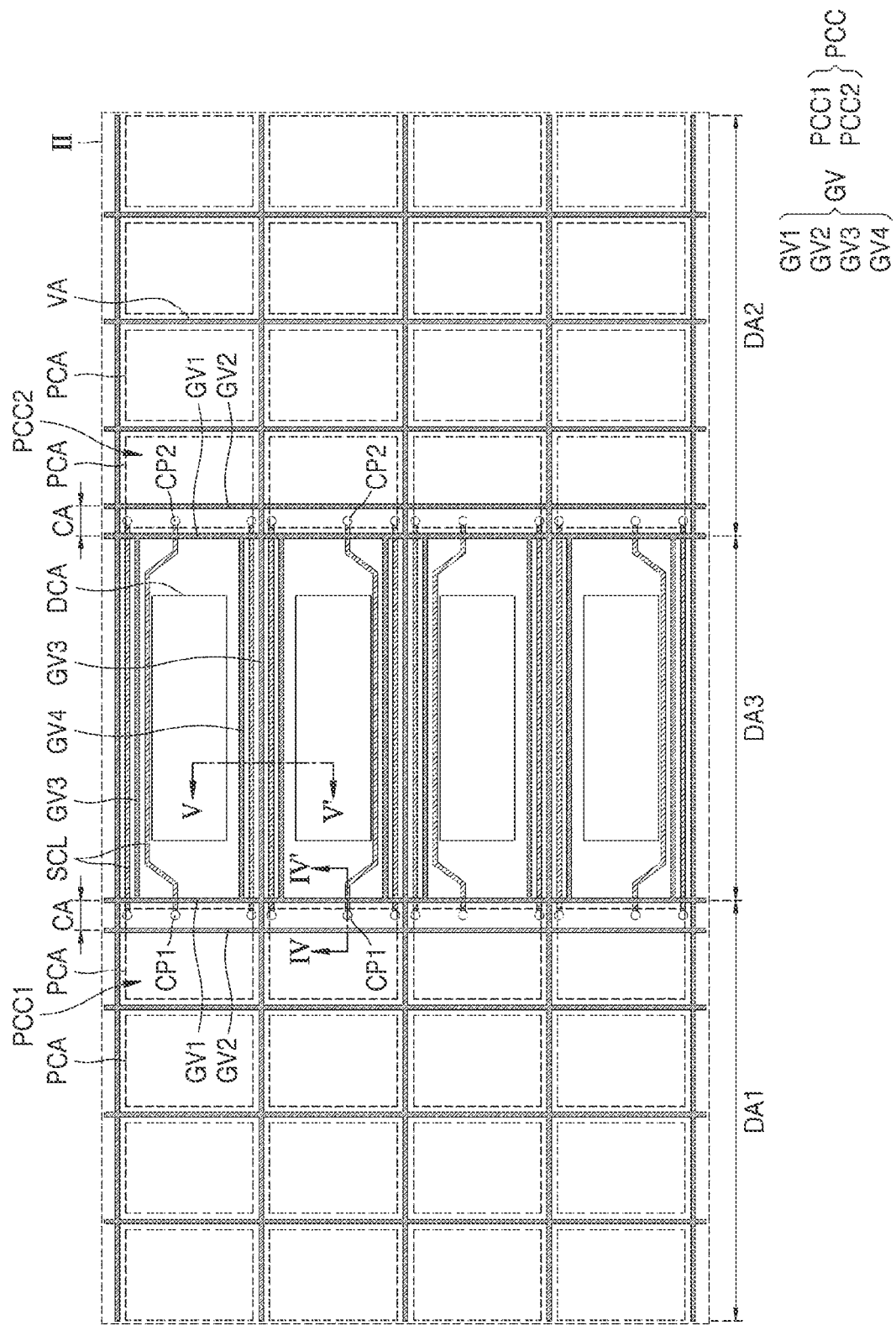
FIGS. 5 and 6 are enlarged plan views showing a region II of FIG. 1 according to some embodiments.
Figure 6:
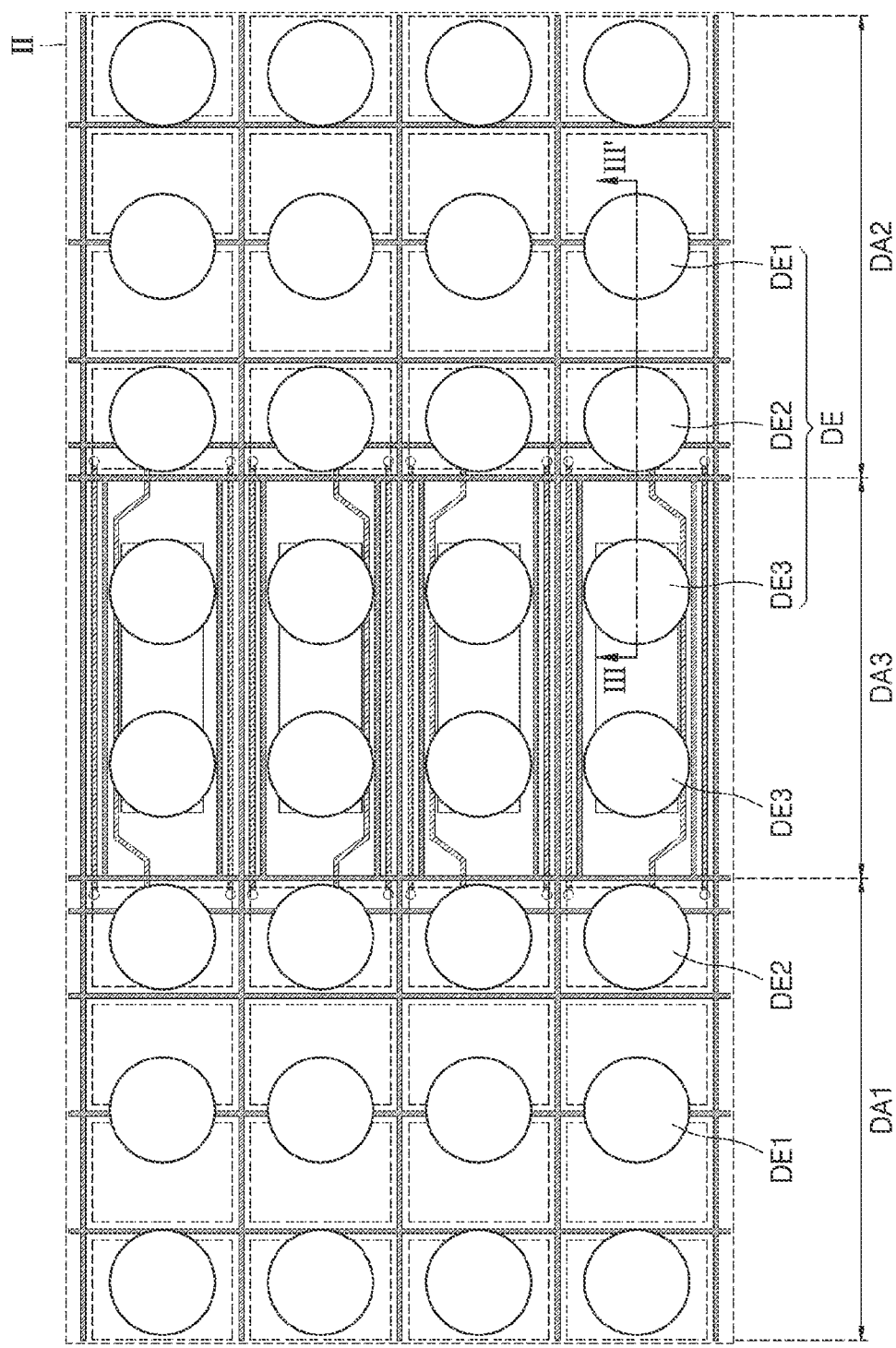

FIGS. 5 and 6 are enlarged plan views of examples of a portion of the display panel corresponding to the region II of FIG. 1.

Referring to FIG. 5, the display area DA of the display panel 10 may include a plurality of pixel circuit areas PCA and a plurality of driver circuit areas DCA.

The pixel circuit areas PCA may be repeated in an x direction and a y direction. The pixel circuit area PCA may be an area where a pixel circuit PC of a pixel and signal lines connected to the pixel circuit PC are arranged. The driver circuit areas DCA may be repeated in the y direction. The driver circuit area DCA may be an area where driver circuits DC and signal lines connected thereto are arranged. In the driver circuit area DCA, the driver circuits DC may be repeatedly arranged in the x direction and/or the y direction. The driver circuits DC may each be a scan driver circuit or an emission driver circuit.

The display area DA may include a first display area DA1, a second display area DA2, and a third display area DA3. The second display area DA2 may be located between the first display area DA1 and the third display area DA3. The pixel circuit areas PCA may be located between the first display area DA1 and the second display area DA2. The driver circuit area DCA may be located in the third display area DA3.

Referring to FIG. 5, a connection pixel circuit PCC may be arranged in the pixel circuit area PCA. One connection pixel circuit PPC may correspond to any one of the pixel circuits PC. The connection pixel circuit PPC may be arranged in the first display area DA1 and the second display area DA2.

The connection pixel circuit PPC may include a first connection pixel circuit PCC1 arranged in the first display area DA1 and a second connection pixel circuit PCC2 arranged in the second display area DA2.

The first connection pixel circuit PCC1 may be arranged on an edge portion of the first display area DA1 that is adjacent to the third display area DA3. The second connection pixel circuit PCC2 may be arranged on an edge portion of the second display area DA2 that is adjacent to the third display area DA3. According to some embodiments, the first connection pixel circuit PCC1 may be a pixel circuit PC that is the closest to the driver circuit DC in the first direction (e.g., the x direction), in the first display area DA1. The second connection pixel circuit PCC2 may be a pixel circuit PC that is the closest to the driver circuit DC in the first direction (e.g., the x direction), in the second display area DA2. For example, the first connection pixel circuit PCC1 and the second connection pixel circuit PCC2 may each be the third pixel circuit PC3 described with reference to FIG. 2.

The first connection pixel circuit PCC1 may be provided in the plural, and the first connection pixel circuits PCC1 may be repeatedly arranged in the second direction (e.g., the y direction). Likewise, the second connection pixel circuit PCC2 may be provided in the plural, and the second connection pixel circuits PCC2 may be repeatedly arranged in the second direction (e.g., the y direction).

Referring to FIG. 5, a signal connection line SCL may be arranged in the third display area DA3. The signal connection line SCL may extend in the second direction (e.g., the y direction) and partially overlap the first display area DA1 and the second display area DA2. The signal connection line SCL may be provided in the plural.

The first connection pixel circuit PCC1 may include a first contact portion CP1, and the second connection pixel circuit PCC2 may include a second contact portion CP2. The first contact portion CP1 may be a portion of the first connection pixel circuit PCC1 connected to the signal connection line SCL. The second contact portion CP2 may be a portion of the second connection pixel circuit PCC2 connected to the signal connection line SCL.

The signal connection line SCL may be connected to the first contact portion CP1 of the first connection pixel circuit PCC1 and the second contact portion CP2 of the second connection pixel circuit PCC2. The signal connection line SCL may connect various signals, such as scan signals of the first connection pixel circuit PCC1 and the second connection pixel circuit PCC2, and an emission control signal. That is, the signal connection line SCL may connect various signals of the pixel circuits PC which may be cut as the driver circuit DC is arranged in the display area DA.

The signal connection line SCL may bypass the driver circuit area DCA. That is, the signal connection line SCL may not overlap the driver circuit DC. When the driver circuit DC is arranged while the signal connection line SCL extends in the first direction (e.g., the x direction), the signal connection line SCL may extend in a third direction crossing the first direction and then may extend again in the first direction.

Referring back to FIG. 5, the display area DA may include a plurality of grooves GV. The grooves GV may extend in the first direction (e.g., the x direction) or the second direction (e.g., the y direction). The grooves GV may include a first groove GV1, a second groove GV2, a third groove GV3, and a fourth groove GV4.

The first groove GV1 may be arranged between the first contact portion CP1 and the driver circuit area DCA and/or between the second contact portion CP2 and the driver circuit area DCA. The first groove GV1 may extend in the second direction (e.g., the y direction). The first groove GV1 may be in parallel with a boundary between the first display area DA1 and the third display area DA3. The first groove GV1 may be in parallel with the boundary between the second display area DA2 and the third display area DA3. The first groove GV1 may cross the signal connection line SCL in a plane.

The first contact portion CP1 and/or the second contact portion CP2 may be separated from the driver circuit area DCA with the first groove GV1 therebetween. Accordingly, coupling that may be generated between each of the first contact portion CP1 and the second contact portion CP2 and the driver circuit DC may be relatively reduced.

The second groove GV2 may overlap the first connection pixel circuit PCC1 and extend in the second direction (e.g., the y direction). Also, the second groove GV2 may overlap the second connection pixel circuit PCC2 and extend in the second direction (e.g., the y direction). The second groove GV2 may be arranged in parallel with the first groove GV1 with the first contact portion CP1 and/or the second contact portion CP2 therebetween. Accordingly, the first contact portion CP1 and the second contact portion CP2 may be respectively surrounded by the first groove GV1 and the second groove GV2 in the first direction (e.g., the x direction).

The third groove GV3 may extend in the first direction (e.g., the x direction) and may be arranged in the third display area DA3. The third groove GV3 may be arranged between the signal connection lines SCL. That is, the third groove GV3 may be arranged between two adjacent signal connection lines SCL. The third groove GV3 may be arranged in parallel with adjacent signal connection lines SCL.

The fourth groove GV4 may extend in the first direction (e.g., the x direction) and may be arranged in the third display area DA3. The fourth groove GV4 may be arranged between the signal connection line SCL and the driver circuit DC. The fourth groove GV4 may be arranged in parallel with adjacent signal connection lines SCL.

The grooves GV may be arranged to surround to the pixel circuit area PCA in addition to the first groove GV1 to the fourth groove GV4.

The grooves GV may be formed in a first insulating layer IL1 described below. The grooves GV may have shapes in which portions of the first insulating layer IL are removed. In this case, the first insulating layer IL1 may be an inorganic insulating layer and include insulating layers. The second insulating layer IL2 may be buried in the grooves GV. The second insulating layer IL2 may be an organic insulating layer. Because the second insulating layer IL2 buried in the grooves GV includes an organic material, the propagation of cracks, which are formed in the first insulating layer IL1 of a pixel because of external impact, to adjacent pixels may be prevented or relatively reduced.

In the display apparatus according to some embodiments, the driver circuit DC is arranged in the display area DA, and thus, the dead space may be relatively reduced and the display apparatus may be robust to the external impact. Also, in an area where the driver circuit DC is arranged, coupling occurring between adjacent signal connection lines SCL or between the signal connection line SCL and the driver circuit DC may be relatively reduced.

Referring to FIG. 6, the display element DE may be located above the pixel circuit PC and the driver circuit DC. The display element DE may be located directly on the pixel circuit PC to overlap the same or may be offset from the pixel circuit PC and arranged to partially overlap a pixel circuit PC of another pixel in an adjacent row and/or column. Alternatively, the display element DE may not overlap the pixel circuit PC connected thereto. According to some embodiments, the display element DE may be an organic light-emitting diode OLED.

Referring to FIG. 6, in the first display area DA1 and the second display area DA2, the first display element DE1 and the second display element DE2 may be arranged. In the third display area DA3, the third display element DE3 may be arranged. The third pixel circuit PC3 connected to the third display element DE3 may be arranged in the first display area DA1 and the second display area DA2 not in the third display area DA3. That is, the third display element DE3 may be connected to the pixel circuit PC arranged in the display area DA other than the third display area DA3, but may be arranged above the driver circuit DC in the third display area DA3.

Figure 7:
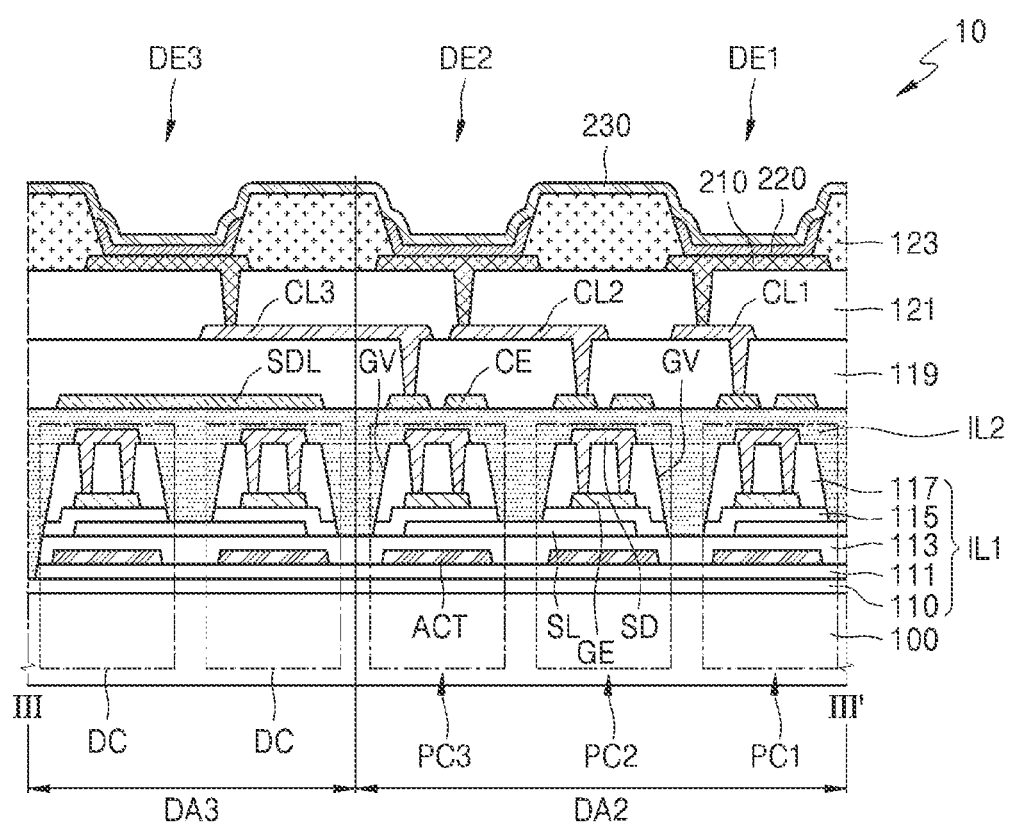
FIG. 7 is an example cross-sectional view of a portion of the display apparatus of FIG. 6, taken along a line III-III' according to some embodiments.

FIG. 7 is an example cross-sectional view of a portion of the display apparatus of FIG. 6, taken along a line III-III'.

Referring to FIG. 7, the display panel 10 may include the second display area DA2 and the third display area DA3. As described above with reference to FIG. 2, the first pixel circuit PC1, the second pixel circuit PC2, and the third pixel circuit PC3 may be arranged in the second display area DA2. In the third display area DA3, the first driver circuit DC1 and the second driver circuit DC2 (see FIG. 2) may be arranged.

In the second display area DA2, the first display element DE1 electrically connected to the first pixel circuit PC1 and the second display element DE2 electrically connected to the second pixel circuit PC2 may be arranged. In the third display area DA3, the third display element DE3 electrically connected to the third pixel circuit PC3 may be arranged. Accordingly, the second display element DE2 may overlap any one of the second pixel circuit PC2 and the third pixel circuit PC3, and the third display element DE3 may overlap any one of the driver circuits DC.

The display panel 10 may further include a connection line CL to connect the display element DE to the pixel circuit PC. The first connection line CL1 connecting the first display element DE1 to the first pixel circuit PC1 may be arranged in the second display area DA2. The second connection line CL2 connecting the second display element DE2 to the second pixel circuit PC2 may be arranged in the second display area DA2. The third connection line CL3 connecting the third display element DE3 to the third pixel circuit PC3 may extend from the second display area DA2 to the third display area DA3 and may be arranged therein.

Hereinafter, with reference to FIG. 7, configurations included in the display panel 10 are described in detail according to the stack structure.

The substrate 100 may include glass or polymer resin. The polymer resin may include polyethersulfone, polyacrylate, polyetherimide, polyethylene naphthalate, polyethylene terephthalate, polyphenylene sulfide, polyarylate, polyimide, polycarbonate, cellulose acetate propionate, or the like. The substrate 100 including polymer resin may be flexible, rollable, or bendable. The substrate 100 may have a multi-layered structure that includes a layer including the above polymer resin and an inorganic layer.

A barrier layer 110 may be located above the substrate 100. The barrier layer 110 may prevent or decrease the penetration of impurities from the substrate 100, etc. to a first semiconductor layer Act1 and a second semiconductor layer Act2. The barrier layer 110 may include an inorganic material, such as oxide or nitride, an organic material, or a compound of organic and inorganic materials and have a single-layer structure or a multilayered structure including organic and inorganic materials.

A buffer layer 111 of the first insulating layer IL1 may be located above the barrier layer 110. The first insulating layer IL1 may include silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like. The first insulating layer IL1 may include the buffer layer 111, a first gate insulating layer 113, a second gate insulating layer 115, and an interlayer insulating layer 117.

A semiconductor layer ACT may be located above the buffer layer 111. The semiconductor layer ACT may include amorphous silicon or polysilicon. According to some embodiments, the semiconductor layer ACT may include oxide of at least one material selected from the group consisting of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). The semiconductor layer ACT may include a channel area and a source area and a drain area arranged on both sides of the channel area. The semiconductor layer Act may be a layer or layers.

The first gate insulating layer 113 may be located above the buffer layer 111 to cover the semiconductor layer ACT. A signal line SL may be located above the first gate insulating layer 113. The signal line SL may include a conductive material including molybdenum (Mo), Al, copper (Cu), or Ti and may be a layer or layers including the above material. For example, the signal line SL may be a single Mo layer.

The second gate insulating layer 115 may be located above the first gate insulating layer 113 to cover the signal line SL. A gate electrode GE may be located above the second gate insulating layer 115. The gate electrode GE may include a conductive material including Mo, Al, Cu, or Ti and may be a layer or layers including the above material. For example, the gate electrode GE may be a single Mo layer.

The interlayer insulating layer 117 may be located above the second gate insulating layer 115 to cover the gate electrode GE. A source drain electrode SD may be located above the interlayer insulating layer 117. The source drain electrode SD may be connected to a lower electrode through at least one contact hole formed in the interlayer insulating layer 117. The source drain electrode SD may include a conductive material including Mo, Al, Cu, or Ti and may be a layer or layers including the above material. For example, the source drain electrode SD may have a multilayered structure of Ti/Al/Ti.

The grooves GV may be formed in the first insulating layer IL1. The grooves GV may be formed in at least one of the buffer layer 111, the first gate insulating layer 113, the second gate insulating layer 115, or the interlayer insulating layer 117. According to some embodiments, the grooves GV may be formed by penetrating the second gate insulating layer 115 and the interlayer insulating layer 117. That is, as shown in FIG. 7, as the grooves GV include openings formed in the second gate insulating layer 115 and the interlayer insulating layer 117, a portion of the signal line SL may be exposed. However, one or more embodiments are not limited thereto, and the grooves GV may be formed by penetrating only the interlayer insulating layer 117.

The grooves GV may be arranged between adjacent pixel circuits PC and/or adjacent driver circuits DC.

The second insulating layer IL2 may be located above the interlayer insulating layer 117 to cover the source drain electrode SD. A portion of the second insulating layer IL2 may be buried in the grooves GV, and other portions of the second insulating layer IL2 may be located above the interlayer insulating layer 117. The second insulating layer IL2 may include a material different from that in the first insulating layer IL1. The second insulating layer IL2 may be a layer or layers including an organic material and provide a flat upper surface. The second insulating layer IL2 may include a general-purpose polymer, such as benzocyclobutene (BCB), polyimide, hexamethyldisiloxane (HMDSO), polymethylmethacrylate (PMMA), or polystyrene (PS), a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, and any blend thereof. The second insulating layer IL2 may include an organic insulating material with a small dielectric constant. The dielectric constant of the second insulating layer IL2 may be less than or equal to about 3.5. As the second insulating layer IL2 is buried in the grooves GV, a step difference in the first insulating layer IL1, which may be generated by the grooves GV, may be removed or relatively reduced.

Also, a portion of the signal line SL may be exposed through the grooves GV, and a portion of the second insulating layer IL2 is buried in the grooves GV; thus, the second insulating layer IL2 may contact the signal line SL. That is, some portions of the signal line SL, which overlap the grooves GV, may extend without a short circuit and thus may electrically connect portions between the pixel circuit areas PCA and the driver circuit areas DCA which are adjacent to each other. Accordingly, in a display apparatus according to some embodiments, an additional conductive layer may not be arranged, wherein the additional conductive layer is required when the signal line SL is disconnected by the grooves GV. As a result, because an inefficient space may be removed not by placing the additional conductive layer, a display apparatus may become robust to external impact and have improved resolution.

A connection electrode CE may be located above the second insulating layer IL2. According to some embodiments, some connection electrodes CE may be connected to the source drain electrode SD through a contact hole formed in the second insulating layer IL2. The connection electrode CE may include a conductive material including Mo, Al, Cu, or Ti and may be a layer or layers including the above material. For example, the connection electrode CE may have a multilayered structure of Ti/Al/Ti.

Also, a shielding layer SDL may be located above the second insulating layer IL2. The shielding layer SDL may be arranged between the driver circuit DC and the third display element DE3 and prevent the driver circuit DC from being affected by electrical signals applied to the third display element DE3. The shielding layer SDL may be arranged between the second insulating layer IL2 and a third insulating layer 119. In this case, as shown in FIG. 7, the shielding layer SDL may be simultaneously (or concurrently) formed by using the same material as other conductive layers, such as the connection electrode CE arranged between the second insulating layer IL2 and the third insulating layer 119. The shielding layer SDL may overlap the driver circuit DC.

A constant voltage may be applied to the shielding layer SDL to ensure the shielding layer SDL to surely prevent the driver circuit DC from being affected by electrical signals applied to the third display element DE3. For example, the shielding layer SDL may be grounded. Alternatively, the shielding layer SDL may be electrically connected to an electrode power supply line. In some cases, the shielding layer SDL may be a portion of a power supply line.

The third insulating layer 119 may be located above the second insulating layer IL2 to cover the connection electrode CE and the shielding layer SDL. The third insulating layer 119 may be a layer or layers including an organic material and provide a flat upper surface. The third insulating layer 119 may include a general-purpose polymer, such as BCB, polyimide, HMDSO, PMMA, or PS, a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, and any blend thereof.

The connection line CL may be located above the third insulating layer 119. The connection line CL may include the first connection line CL1 connecting the first display element DE1 to the first pixel circuit PC1, the second connection line CL2 connecting the second display element DE2 to the second pixel circuit PC2, and the third connection line CL3 connecting the third display element DE3 to the third pixel circuit PC3. The connection line CL may be connected to the connection electrode CE through at least one contact hole formed in the third insulating layer 119. The connection line CL may include a conductive material including Mo, Al, Cu, or Ti and may be a layer or layers including the above material. For example, the connection line CL may have a multilayered structure of Ti/Al/Ti. However, one or more embodiments are not limited thereto, and the connection line CL may include the same material as a pixel electrode 210 described below. Alternatively, a portion of the connection line CL may include a conductive material including Mo, Al, Cu, or Ti, and other portions of the connection line CL may include the same material as the pixel electrode 210.

A fourth insulating layer 121 may be located above the third insulating layer 119 to cover the connection line CL. The fourth insulating layer 121 may be a layer or layers including an organic material and provide a flat upper surface. The fourth insulating layer 121 may include a general-purpose polymer, such as BCB, polyimide, HMDSO, PMMA, or PS, a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, and any blend thereof.

The first display element DE1 to the third display element DE3 may be located above the fourth insulating layer 121. The first display element DE1 to the third display element DE3 may be organic light-emitting diodes OLED. Each of the first display element DE1 to the third display element DE3 may include the pixel electrode 210, an intermediate layer 220 including an organic emission layer, and an opposite electrode 230. The first display element DE1 to the third display element DE3 may be connected to the connection line CL through at least one contact hole formed in the fourth insulating layer 121.

The pixel electrode 210 may be a (semi-)light-transmissive electrode or a reflection electrode. In some embodiments, the pixel electrode 210 may include a reflection layer including silver (Ag), magnesium (Mg), Al, platinum (Pt), palladium (Pd), gold (Au), nickel (Ni), neodymium (Nd), iridium (Ir), chromium (Cr), or a combination thereof, and a transparent or translucent electrode layer formed on the reflection layer. The transparent or translucent electrode layer may include at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In some embodiments, the pixel electrode 210 may have a multilayered structure of ITO/Ag/ITO.

In the display area of the substrate 100, a bank layer 123 may be located above the fourth insulating layer 121. The bank layer 123 may cover edges of the pixel electrode 210 and have an opening exposing a central portion of the pixel electrode 210. An emission area of each of the first display element DE1 to the third display element DE3 may be defined by the opening. The bank layer 123 may increase the distance between the edge of the pixel electrode 210 and the opposite electrode 230 located above the pixel electrode 210 and thus may prevent arcs, etc. from being generated on the edge of the pixel electrode 210.

The bank layer 123 may include one or more organic insulating materials selected from the group consisting of polyimide, polyamide, acryl resin, BCB, and phenol resin and may be formed through a spin coating method or the like. The bank layer 123 may include an organic insulating material. Alternatively, the bank layer 123 may include an inorganic insulating material, such as $SiN_x$, SiON, or $SiO_x$. Alternatively, the bank layer 123 may include an organic insulating material and an inorganic insulating material. In some embodiments, the bank layer 123 may include a light-shielding material and may be black. The light-shielding material may include carbon black, a carbon nanotube, resin or paste including a black dye, metal particles such as Ni, Al, Mo, and an alloy thereof, metal oxide particles (e.g., chromium oxide), or metal nitride particles (e.g., chromium nitride), or the like. When the bank layer 123 includes the light-shielding material, external reflection from metal structures arranged under the bank layer 123 may decrease.

The intermediate layer 220 may be arranged in the opening formed by the bank layer 123 and include the organic emission layer. The organic emission layer may include an organic material including a fluorescent or phosphorescent material emitting red light, green light, blue light, or white light. The organic emission layer may include a low-molecular-weight or a high-molecular-weight organic material, and on and under the organic emission layer, a functional layer such as a hole transport layer (HTL), a hole injection layer (HIL), an electron transport layer (ETL), or an electron injection layer (EIL) may be selectively arranged.

The opposite electrode 230 may be a light-transmissive electrode or a reflection electrode. In some embodiments, the opposite electrode 230 may be a transparent or translucent electrode and may include a metal thin-film having a low work function and including Li, Ca, LiF/Ca, LiF/Al, Al, Ag, Mg, and a compound thereof. Also, a transparent conductive oxide (TCO) layer including ITO, IZO, ZnO, or $In_2O_3$ may be further located above the metal thin-film. The opposite electrode 230 may be arranged over the display area DA and located above the intermediate layer 220 and the bank layer 123. The opposite electrode 230 may be integrally formed over the first display element DE1 to the third display element DE3 as a single body and correspond to the pixel electrodes 210.

The display elements DE may be easily damaged by external moisture, oxygen, or the like so that an encapsulation layer may cover the display elements DE to protect the same. The encapsulation layer may cover the display area and extend to at least a portion of the peripheral area. The encapsulation layer may include a first inorganic encapsulation layer, an organic encapsulation layer, and a second inorganic encapsulation layer.

Figure 8:
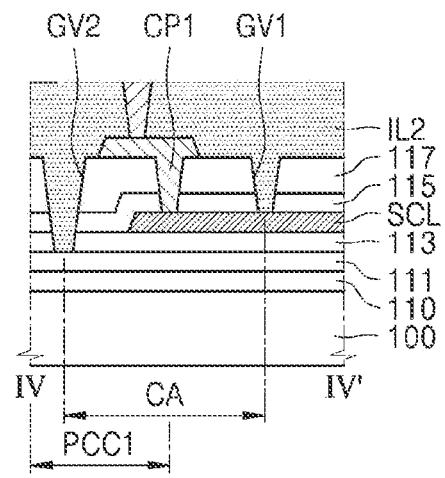
FIG. 8 is an example cross-sectional view of a portion of the display apparatus of FIG. 5, taken along a line IV-IV' according to some embodiments.

FIG. 8 is an example cross-sectional view of a portion of the display apparatus of FIG. 5, taken along a line IV-IV'.

FIG. 8 shows a first groove GV1, a second groove GV2, and a contact area CA in the vicinity of the first contact portion CP1.

Referring to FIG. 8, the display apparatus 1 may include the substrate 100, the signal connection line SCL on the substrate 100, the first insulating layer IL1 including the grooves GV, and the second insulating layer IL2 buried in the grooves GV.

For convenience, FIG. 8 shows that the signal connection line SCL is arranged on the first gate insulating layer 113, that is, on the same layer as the signal line SL of FIG. 7, but one or more embodiments are not limited thereto. According to some embodiments, the signal connection line SCL may be located under the first gate insulating layer 113. According to some embodiments, the signal connection line SCL may be arranged on the same layer as the gate electrode (GE, see FIG. 7) located above the second gate insulating layer 115. According to some embodiments, the signal connection line SCL may be arranged on the same layer as the source drain electrode (SD, see FIG. 7) located above the interlayer insulating layer 117. For convenience of explanation, it is described that the signal connection line SCL is arranged between the first gate insulating layer 113 and the second gate insulating layer 115, as shown in FIG. 8.

The first groove GV1 may be formed by penetrating the second gate insulating layer 115 and the interlayer insulating layer 117. That is, as the first groove GV1 includes an opening formed in the first gate insulating layer 113, the second gate insulating layer 115, and the interlayer insulating layer 117, a portion of the signal connection line SCL may be exposed. The first insulating layer IL1 may be an inorganic insulating layer, and the second insulating layer IL2 may be an organic insulating layer with a small dielectric constant. The first groove GV1 may be filled with the organic insulating material with a small dielectric constant. The dielectric constant of the second insulating layer IL2 may be less than or equal to about 3.5. Accordingly, the first groove GV1 may shield against signal interference among adjacent lines.

The second groove GV2 may be formed by penetrating the first gate insulating layer 113, the second gate insulating layer 115, and the interlayer insulating layer 117. That is, as the second groove GV2 includes an opening formed in the first gate insulating layer 113, the second gate insulating layer 115, and the interlayer insulating layer 117, a portion of the buffer layer 111 may be exposed. However, one or more embodiments are not limited thereto, and the second groove GV2 may be formed by penetrating only the interlayer insulating layer 117 or only the interlayer insulating layer 117 and the second gate insulating layer 115.

The first contact portion CP1 may be located in the contact area CA, and the contact area CA may be defined as an area between the first groove GV1 and the second groove GV2. The first contact portion CP1 may be a portion in which the signal connection line SCL is connected to the first connection pixel circuit PCC1. According to some embodiments, the first contact portion CP1 may be located above the interlayer insulating layer 117. The first contact portion CP1 may be arranged on the same layer as the source drain electrode SD of FIG. 7 and include the same material.

The first connection pixel circuit PCC1 may be electrically connected to the signal connection line SCL through the first contact portion CP1. As described above with reference to FIG. 6, the signal connection line SCL may extend in the first direction (e.g., the x direction) and may be connected to the first contact portion CP1 in the first display area DA1 and the second contact portion CP2 in the second display area DA2. Accordingly, even if there is the third display area DA3 in which the driver circuit area DCA is located between the first display area DA1 and the second display area DA2, various signals applied to the first display area DA1 may be transmitted to the second display area DA2. Also, because the first contact portion CP1 is arranged between the first groove GV1 and the second groove GV2, and because the second insulating layer IL2 including an organic insulating material is buried in the first groove GV1 and the second groove GV2, signal interference between the first contact portion CP1 and the driver circuit DC may decrease. The description regarding the first contact portion CP1 described with reference to FIG. 8 may also be applied to the second contact portion CP2.

Figure 9:
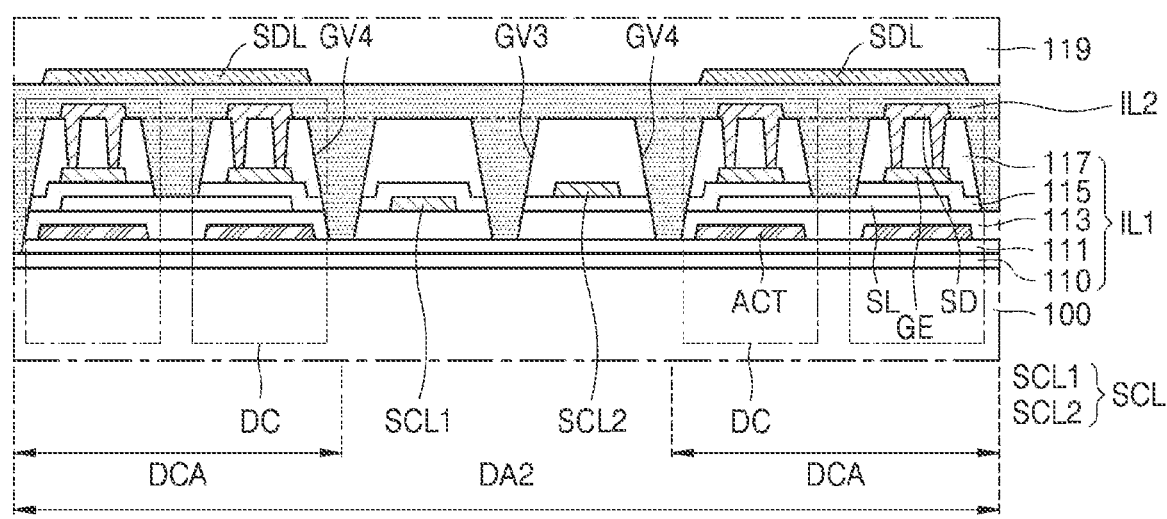
FIG. 9 is an example cross-sectional view of a portion of the display apparatus of FIG. 5, taken along a line V-V' according to some embodiments.

FIG. 9 is an example cross-sectional view of a portion of the display apparatus of FIG. 5, taken along a line V-V'.

Referring to FIGS. 5 and 9, the signal connection line SCL may be provided in the plural. The signal connection lines SCL may be arranged on different layers. For example, as shown in FIG. 9, the first signal connection line SCL1 may be located above the first gate insulating layer 113, and the second signal connection line SCL2 may be located above the second gate insulating layer 115.

The first signal connection line SCL1 and the second signal connection line SCL2 may be respectively connected to the first contact portion CP1 in the first display area DA1 and the second contact portion CP2 in the second display area DA2 and extend in the first direction (e.g., the x direction).

The third groove GV3 may be arranged between the first signal connection line SCL1 and the second signal connection line SCL2. The third groove GV3 may be formed by penetrating the first gate insulating layer 113, the second gate insulating layer 115, and the interlayer insulating layer 117. That is, as the third groove GV3 includes an opening formed in the first gate insulating layer 113, the second gate insulating layer 115, and the interlayer insulating layer 117, a portion of the buffer layer 111 may be exposed. However, one or more embodiments are not limited thereto, and the third groove GV3 may be formed by penetrating only the interlayer insulating layer 117 or only the interlayer insulating layer 117 and the second gate insulating layer 115.

The fourth groove GV4 may be arranged between the signal connection line SCL and the driver circuit DC. The fourth groove GV4 may be formed by penetrating the first gate insulating layer 113, the second gate insulating layer 115, and the interlayer insulating layer 117. That is, as the fourth groove GV4 includes an opening formed in the first gate insulating layer 113, the second gate insulating layer 115, and the interlayer insulating layer 117, a portion of the buffer layer 111 may be exposed. However, one or more embodiments are not limited thereto, and the fourth groove GV4 may be formed by penetrating only the interlayer insulating layer 117 or only the interlayer insulating layer 117 and the second gate insulating layer 115.

Referring to FIG. 9, a distance from an upper surface of the substrate 100 to a lower surface of each of the third groove GV3 and the fourth groove GV4 may be less than or equal to a distance from the upper surface of the substrate 100 to a lower surface of the signal connection line SCL. Here, the lower surface of the groove GV refers to an upper surface of a layer exposed by the groove GV.

Accordingly, the signal connection lines SCL may be separated from each other by the third groove GV3, and the signal connection line SCL and the driver circuit DC may be separated from each other by the fourth groove GV4. Because the third groove GV3 and the fourth groove GV4 may be filled with the second insulating layer IL2 including an organic insulating material with a small dielectric constant, interference between the signal connection lines SCL or interference between the signal connection line SCL and the driver circuit DC may decrease.

The display apparatus is mainly described, but one or more embodiments are not limited thereto. For example, a method of manufacturing a display apparatus to manufacture such a display apparatus may also be included in the scope of embodiments according to the present disclosure.

According to the one or more embodiments, a high-resolution display apparatus that is relatively robust and flexible to external impact may be realized. However, the scope of the disclosure is not limited by the effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display apparatus comprising:
   a substrate having a first display area, a second display area, a third display area between the first display area and the second display area, and a non-display area;
   a first connection pixel circuit in the first display area;
   a second connection pixel circuit in the second display area;
   a driver circuit in the third display area;
   a signal connection line extending only partially into the first display area to be connected to a first contact portion of the first connection pixel circuit and extending only partially into the second display area to be connected to a second contact portion of the second connection pixel circuit and extending in a first direction to pass through an entirety of the third display area along the first direction; and
   an inorganic insulating layer comprising a first groove between the driver circuit and at least any one of the first contact portion and the second contact portion, the first groove extending in a second direction and crossing the signal connection line in a plan view.

2. The display apparatus of claim 1, further comprising an organic insulating layer, at least a portion of which is buried in the first groove.

3. The display apparatus of claim 2, wherein a dielectric constant of the organic insulating layer is less than or equal to 3.5.

4. The display apparatus of claim 2, further comprising:
   a connection electrode above the organic insulating layer; and
   a display element above the connection electrode and comprising a pixel electrode, an emission layer, and an opposite electrode,
   wherein at least a portion of the emission layer overlaps the driver circuit.

5. The display apparatus of claim 1, wherein the inorganic insulating layer further comprises a second groove extending in the second direction and in parallel with the first groove with the first contact portion or the second contact portion therebetween.

6. The display apparatus of claim 1, wherein the first contact portion is on an edge portion of the first connection pixel circuit that is adjacent to the driver circuit, and
the second contact portion is on an edge portion of the second connection pixel circuit that is adjacent to the driver circuit.

7. The display apparatus of claim 1, wherein the signal connection line bypasses the driver circuit.

8. The display apparatus of claim 7, wherein the signal connection line is provided in plural, and
the inorganic insulating layer further comprises a third groove between two adjacent signal connection lines among the plurality of signal connection lines.

9. The display apparatus of claim 7, wherein the inorganic insulating layer further comprises a fourth groove between the signal connection line and the driver circuit, the fourth groove extending in the first direction.

10. The display apparatus of claim 1, wherein the first display area, the third display area, and the second display area are arranged in the first direction.

11. A display apparatus comprising:
a substrate having a first display area, a second display area, a third display area between the first display area and the second display area, and a non-display area;
a first connection pixel circuit in the first display area and comprising a first contact portion adjacent to the third display area;
a second connection pixel circuit in the second display area and comprising a second contact portion adjacent to the third display area;
a driver circuit in the third display area;
a signal connection line extending in a first direction only partially into the first display area and having an end connected to the first contact portion and extending only partially into the second display area and having another end connected to the second contact portion and extending across an entirety of the third display area along the first direction;
an inorganic insulating layer comprising a plurality of grooves; and
an organic insulating layer filling the plurality of grooves,
wherein a first groove among the plurality of grooves extends in a second direction crossing the first direction and is between the driver circuit and the first contact portion and between the driver circuit and the second contact portion.

12. The display apparatus of claim 11, wherein the signal connection line crosses the third display area and bypasses the driver circuit.

13. The display apparatus of claim 11, wherein the signal connection line crosses the first groove in a plan view.

14. The display apparatus of claim 11, wherein a dielectric constant of the organic insulating layer is less than or equal to 3.5.

15. The display apparatus of claim 11, further comprising:
a connection electrode above the organic insulating layer; and
a display element above the connection electrode and comprising a pixel electrode, an emission layer, and an opposite electrode,
wherein at least a portion of the emission layer overlaps the driver circuit in a plan view.

16. The display apparatus of claim 11, wherein the plurality of grooves further comprise a second groove extending in the second direction and in parallel with the first groove with the first contact portion or the second contact portion therebetween.

17. The display apparatus of claim 11, wherein the signal connection line is provided in plural, and
the plurality of grooves further comprise a third groove between two adjacent signal connection lines among the plurality of signal connection lines.

18. The display apparatus of claim 17, wherein the plurality of grooves further comprise a fourth groove between the signal connection line and the driver circuit, the fourth groove extending in the first direction.

19. The display apparatus of claim 18, wherein a distance from an upper surface of the substrate to a lower surface of each of the third groove and the fourth groove is less than or equal to a distance from the upper surface of the substrate to a lower surface of the signal connection line.

20. The display apparatus of claim 11, wherein the first display area, the third display area, and the second display area are arranged in the first direction.

* * * * *